United States Patent [19]
Lin et al.

[11] Patent Number: 6,009,032
[45] Date of Patent: Dec. 28, 1999

[54] HIGH-SPEED CELL-SENSING UNIT FOR A SEMICONDUCTOR MEMORY DEVICE

[75] Inventors: Hsiu-Ping Lin, Taipei; Hsing-Yi Chen, Hsin-Chu Hsien, both of Taiwan

[73] Assignee: Silicon Integrated Systems Corp., Hsin-Chu, Taiwan

[21] Appl. No.: 09/326,051

[22] Filed: Jun. 4, 1999

[51] Int. Cl.[6] .................................................. G11C 7/06
[52] U.S. Cl. .......................... 365/208; 365/207; 365/190; 365/196; 365/189.09; 365/189.06; 327/52; 327/53; 327/54
[58] Field of Search .................................. 365/207, 208, 365/190, 189.09, 196, 189.06; 327/52, 53, 54, 56

[56] References Cited

U.S. PATENT DOCUMENTS 5,828,614  10/1998  Gradinariu .............................. 365/208

*Primary Examiner*—Andrew Q. Tran
*Attorney, Agent, or Firm*—Ladas & Parry

[57] ABSTRACT

A cell-sensing unit is applied to a memory device having a cell associated operably with a complementary pair of bit lines and a word line. The cell-sensing unit includes a current sense amplifier having a first input side adapted to be connected to the bit lines, and a first output side, and a voltage amplifier having a second input side connected to the first output side of the current sense amplifier, and a second output side. The current sense amplifier is capable of magnifying a difference between currents flowing through the bit lines during a read cycle of the cell, and generates a corresponding voltage difference at the first output side. The voltage difference is received by the voltage amplifier at the second input side, and has a magnitude sufficient to enable the voltage amplifier to generate an output signal at the second output side corresponding to data stored in the cell.

20 Claims, 6 Drawing Sheets

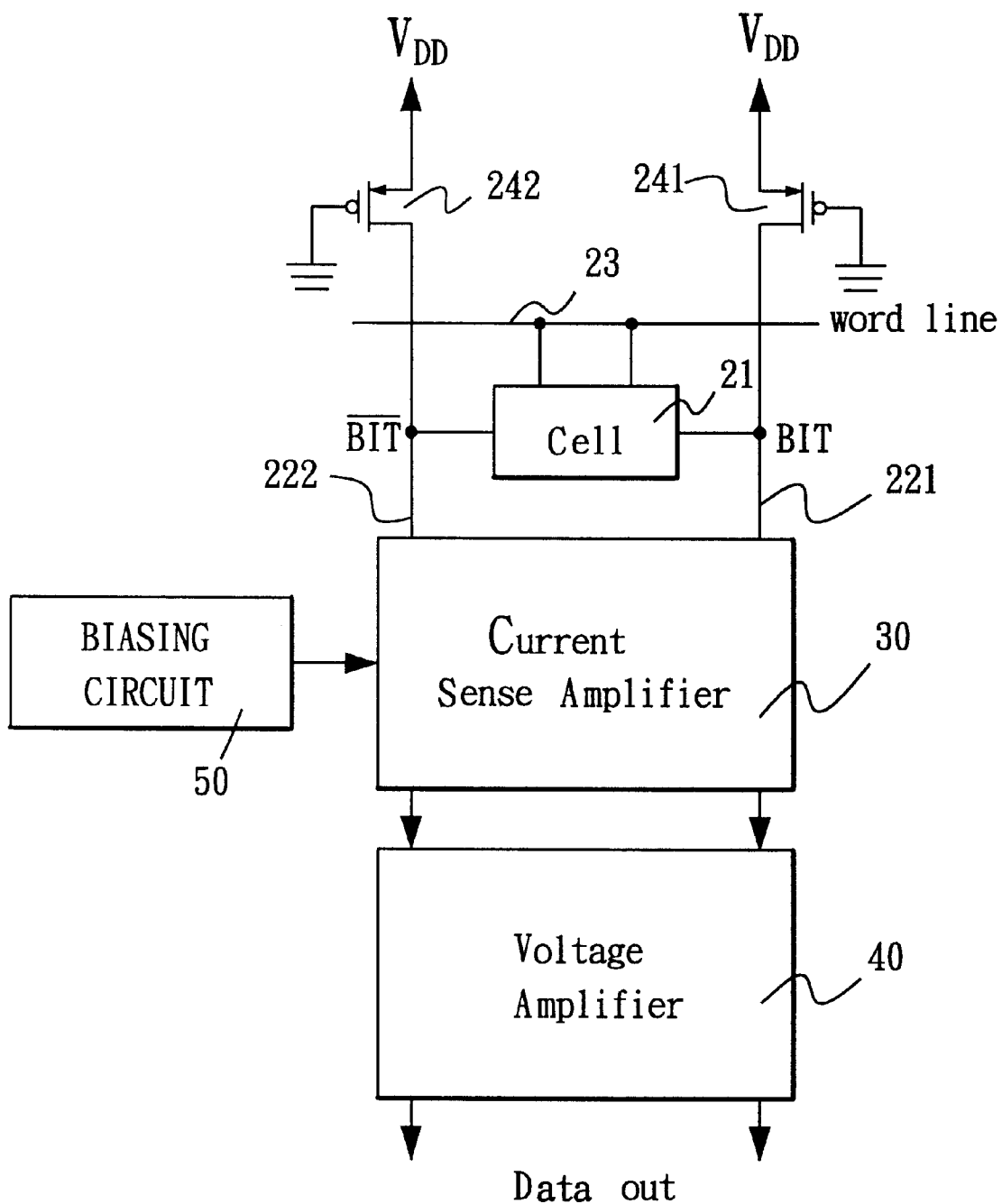
F I G. 3

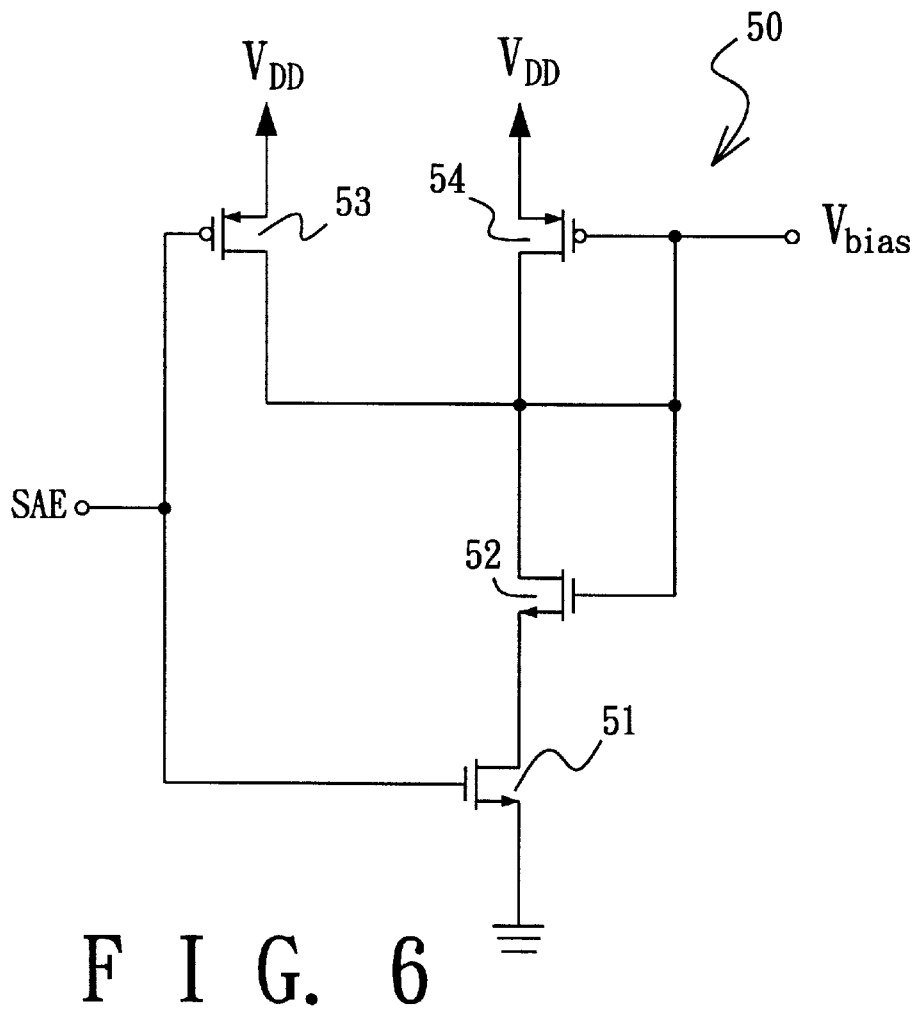
F I G. 6
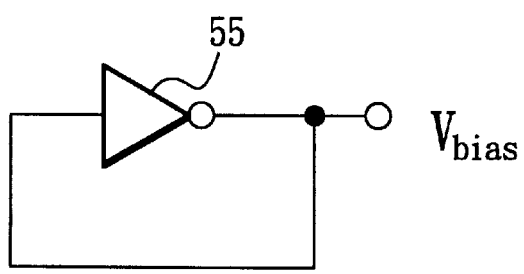
F I G. 7

HIGH-SPEED CELL-SENSING UNIT FOR A SEMICONDUCTOR MEMORY DEVICE

BACKGROUND OF THE INVENTION

1. Field of the Invention

The invention relates to a semiconductor memory device, more particularly to a high-speed cell-sensing unit for a semiconductor memory device.

2. Description of the Related Art

Referring to FIGS. 1 and 2, a cell 11 of a conventional random access memory device is associated with a complementary pair of bit lines (BIT, /BIT) 121, 122, and a word line 13. A voltage sense amplifier 10, such as a current-mirror voltage sense amplifier, is formed from five transistors (M1), (M2), (M3), (M4), (M5), and has input terminals (V1), (V2) connected to the bit lines 121, 122, and output terminals (V3), (V4)

To illustrate the operation of the known voltage sense amplifier 10, it is assumed that the bit lines 121, 122 are pre-charged to a same certain voltage (Vp) prior to operation of the voltage sense amplifier 10, and that a data "1" is stored in the cell 11 of the memory device. When the pre-charging voltage is deactivated, and the word line 13 is activated, the bit line (BIT) 121 will be maintained at a high "1" logic state due to a charging action thereon by the cell 11. On the other hand, the bit line (/BIT) 122 will discharge to a low "0" logic state. At this time, when the control signal ($\phi$) is active, the amplifier 10 begins to operate. Assuming that the transistors (M1), (M2), (M3), (M4) of the amplifier 10 initially operate at the saturation region such that the voltages at the input terminals (V1), (V2) are approximately equal to (Vp), the voltages at the output terminals (V3), (V4) are approximately equal to ($V_{DD}-V_{thP}$), where ($V_{thP}$) is the threshold voltage of the transistors (M3), (M4).

As the bit line (/BIT) 122 discharges to the low "0" logic state, the voltage at the input terminal (V2) decreases. According to the following Equation (I), which is the drain current equation for an MOS transistor operating in the saturation region:

$$Id = k\tfrac{1}{2}(V_{GS}-V_{th})^2 \quad (I),$$

a decrease in the voltage at the input terminal (V2) will result in a corresponding decrease in the gate-source voltage ($V_{GS}$) of the transistor (M2), and in the drain current of the transistor (M2). At the same time, the drain current of the transistor (M4) will decrease, thereby resulting in a corresponding decrease in the gate-source voltage ($V_{GS}$) of the transistor (M4) and in an increase in the gate voltage (V4) of the transistor (M4). Since the transistors (M3), (M4) are in a current-mirror configuration, the decrease in the drain current of the transistor (M4) will result in a corresponding decrease in the drain currents of the transistors (M3), (M1). However, since the bit line (BIT) 121 is continuously charged by the cell 11, the input terminal (V1) can be maintained at the high "1" logic state. Further reduction in the drain current of the transistor (M1) will eventually result in operation of the transistor (M1) in the triode region. According to the following Equation (II), which is the drain current equation for an MOS transistor operating in the triode region:

$$Id = k[(V_{GS}-V_{th})V_{DS}-\tfrac{1}{2}V_{GS}^2] \quad (II),$$

when the voltage at the input terminal (V1) and thus, the gate-source voltage (VGS) of the transistor (M1), remains unchanged, a reduction in the drain current of the transistor (M1) will result in a corresponding reduction in the drain-source voltage (VDS) of the transistor (M1), thereby leading to a reduction in the voltage at the output terminal (V3). Therefore, when the voltage at the input terminal (V2) continues to drop, the drain currents of the transistors (M4), (M3), (M1) will be reduced correspondingly so that the voltage at the output terminal (V3) will also drop.

When the bit line (/BIT) 122 continues to discharge to the low "0" logic state, the drain current of the transistor (M2) will approach 0 A. The transistors (M2), (M4) will eventually be turned off, and the voltage at the output terminal (V4) will approach the supply voltage ($V_{DD}$). With the transistor (M3) turned off, and the transistor (M1) turned on, the voltage at the output terminal (V3) will be approximately equal to 0 volt. Therefore, it can be understood from the foregoing description and from Equations (I) and (II) that current is largest at the initial stage of operation of the entire system, and is subsequently and gradually reduced to approximately 0 A.

Recent progress in semiconductor manufacturing techniques has resulted in smaller component sizes, higher densities, and in higher operating frequencies. In order to maintain component reliability and reduce power consumption, a reduction in the supply voltage is unavoidable. However, a lower supply voltage will result in the following drawbacks for the aforesaid conventional memory device that incorporates the current-mirror voltage sense amplifier 10:

Upon pre-charging of the bit lines 121, 122, the maximum voltage thereat will be equal to the supply voltage ($V_{DD}$) minus the threshold voltage ($V_{thN}$) of the associated NMOS bit-line load 141, 142. Thus, the maximum voltage at the input terminals (V1), (V2) of the amplifier 10 will be approximately equal to $\tfrac{1}{2}V_{DD}$, which is ideal for optimum voltage gain. However, when the supply voltage ($V_{DD}$) is reduced, the maximum voltage at the bit lines 121, 122 will be correspondingly lowered because the threshold voltages ($V_{thN}$) of the NMOS bit-line loads 141, 142 have fixed values. Thus, the noise margin of the cell 11 will be poorer, and the stability and soft error immunity of the cell 11 during a read cycle of the memory device will be adversely affected.

It has been proposed heretofore to employ PMOS transistors as bit-line loads instead of NMOS transistors during low supply voltage applications. However, when PMOS bit-line loads are in use, the maximum voltage at the bit lines 121, 122 will be approximately equal to the supply voltage ($V_{DD}$), thereby affecting adversely the gain of the amplifier 10. Moreover, it is noted that the area of the cell 11 is very small as compared to that of the bit lines 121, 122, and that a very large parasitic capacitance is present across the bit lines 121, 122. Thus, charging and discharging of the bit lines 121, 122 during a read cycle of the memory device require a relatively long amount of time, thereby affecting adversely the formation of a sufficient voltage difference between the input terminals (V1, V2) of the amplifier 10 for enabling the latter to generate a full swing output signal, and further affecting adversely the operating efficiency of the amplifier 10. This drawback is further aggravated during low supply voltage applications.

Furthermore, large amounts of current are generated during the initial stages of operation of the amplifier 10. Due to the relatively long discharge time of the bit lines 121, 122, the amplifier 10 operates under high current conditions for a relatively long period of time, thereby resulting in relatively large power consumption.

SUMMARY OF THE INVENTION

Therefore, the object of the present invention is to provide a cell-sensing unit for a semiconductor memory device capable of overcoming the aforesaid drawbacks commonly associated with the use of a conventional current-mirror voltage sense amplifier.

More particularly, the object of the present invention is to provide a cell-sensing unit for a semiconductor memory device that includes a first-stage current sense amplifier and a second-stage voltage amplifier and that is capable of both high speed and accurate operation even under low supply voltage conditions.

Another object of the present invention is to provide a cell-sensing unit for a semiconductor memory device that consumes a relatively small amount of power.

Accordingly, the cell-sensing unit of this invention is applied to a memory device having a cell associated operably with a complementary pair of bit lines and a word line. The cell-sensing unit includes a first-stage current sense amplifier to be connected to the bit lines, and a second-stage voltage amplifier connected to the first-stage current sense amplifier. Particularly, the current sense amplifier has a first input side adapted to be connected to the bit lines, and a first output side. The voltage amplifier has a second input side connected to the first output side of the current sense amplifier, and a second output side. The current sense amplifier is capable of magnifying a difference between currents flowing through the bit lines during a read cycle of the cell, and generates a corresponding voltage difference at the first output side. The voltage difference is received by the voltage amplifier at the second input side, and has a magnitude sufficient to enable the voltage amplifier to generate an output signal at the second output side corresponding to data stored in the cell.

BRIEF DESCRIPTION OF THE DRAWINGS

Other features and advantages of the present invention will become apparent in the following detailed description of the preferred embodiment with reference to the accompanying drawings, of which:

FIG. 3 is a schematic circuit diagram illustrating how a cell of a memory device is read with the use of the preferred embodiment of a cell-sensing unit according to the present invention;

FIG. 6 is a schematic circuit diagram illustrating a biasing circuit of the preferred embodiment; and FIG. 7 illustrates an equivalent circuit constituted by two transistors of the biasing circuit of FIG. 6 when the latter is enabled.

DETAILED DESCRIPTION OF THE PREFERRED EMBODIMENT

Figure 1:
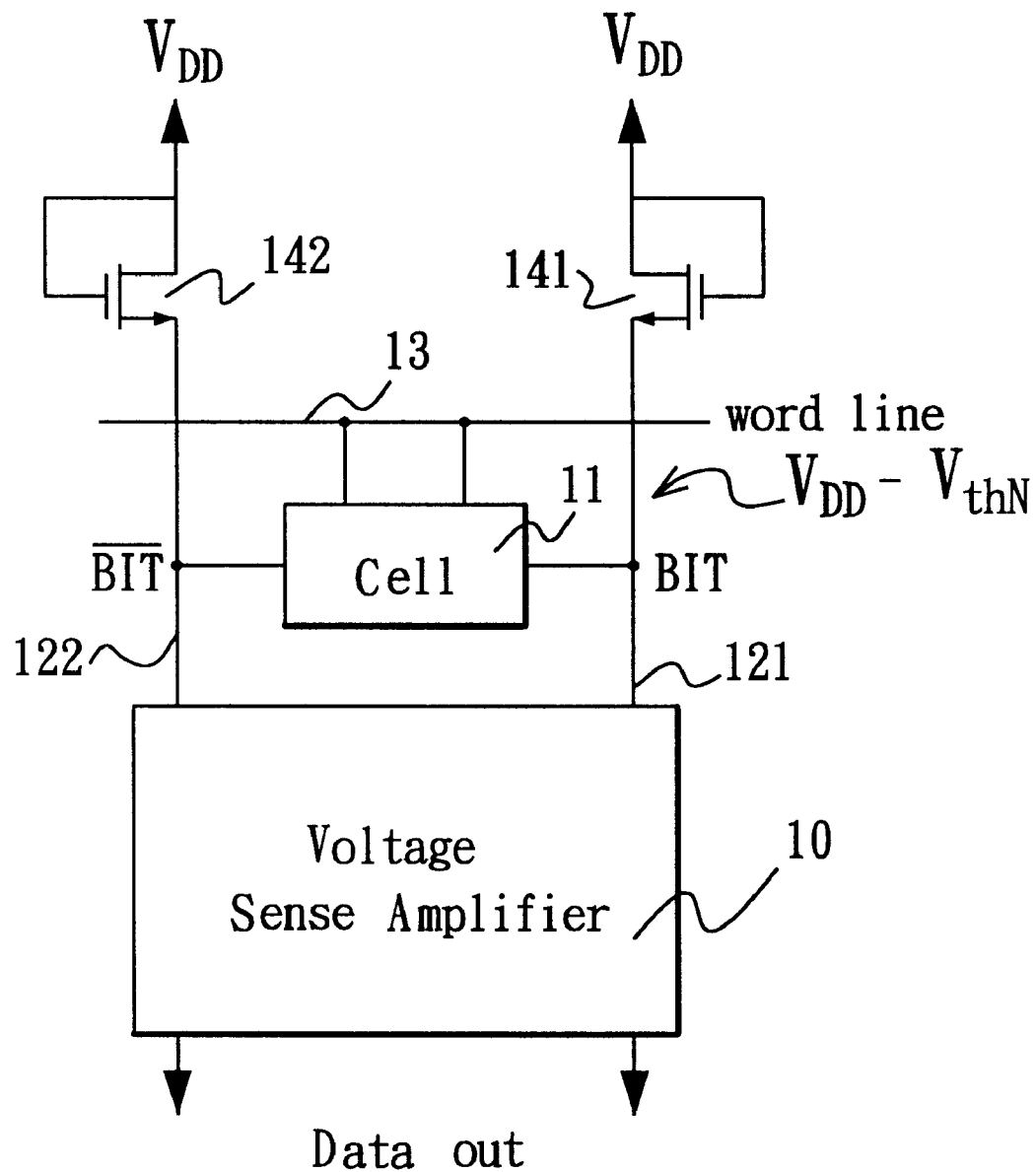
FIG. 1 is a schematic circuit diagram illustrating how a cell of a memory device is read in a conventional manner.
Figure 2:
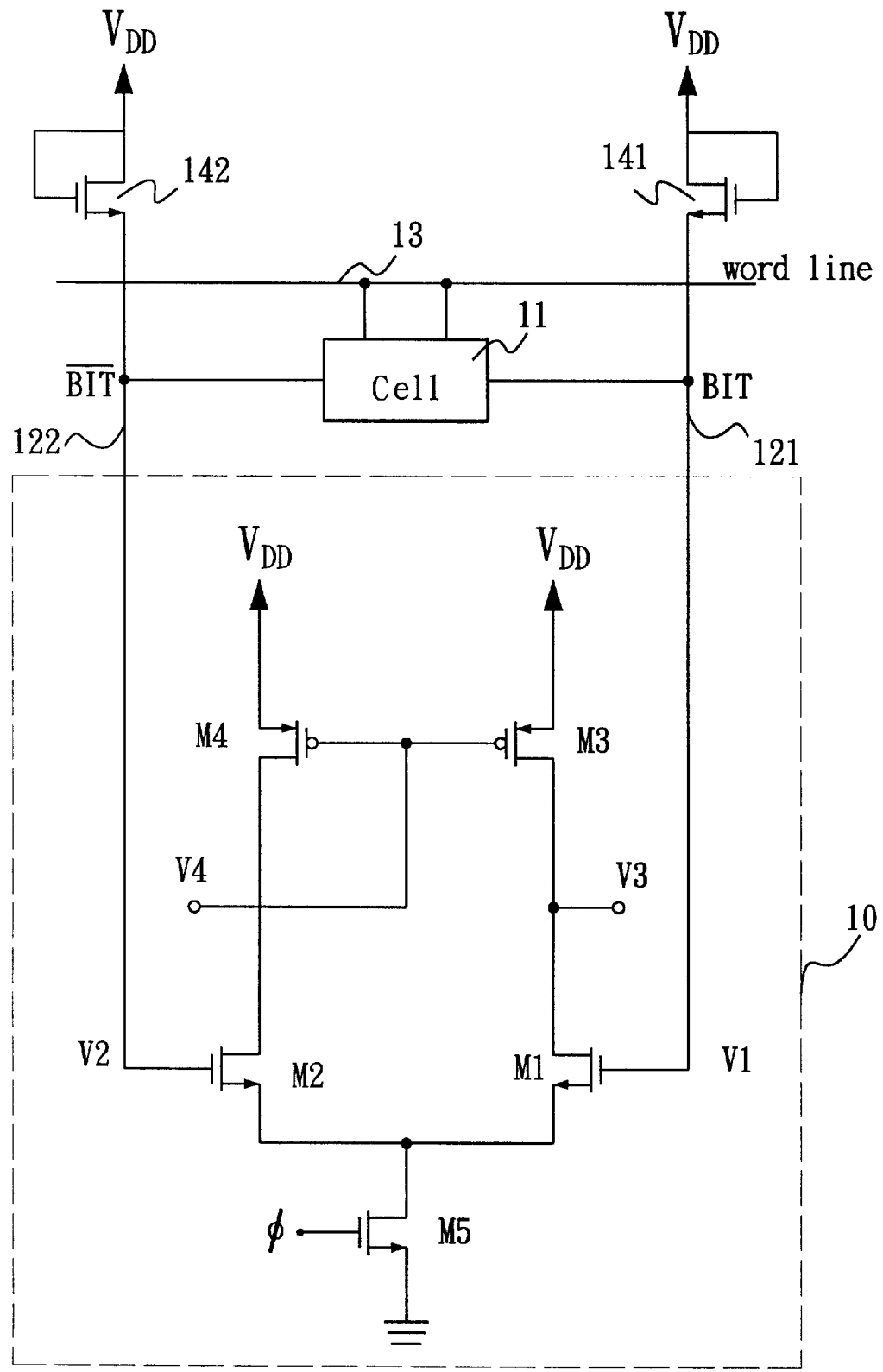
FIG. 2 is a schematic circuit diagram illustrating a conventional current-mirror voltage sense amplifier employed in FIG. 1 in greater detail.

Referring to FIG. 3, the preferred embodiment of a cell-sensing unit according to the present invention is shown to be applied to a semiconductor memory device having a cell 21 that is associated operably with a complementary pair of bit lines (BIT, /BIT) 221, 222, and a word line 23.

Each of the bit lines 221, 222 is connected to a drain supply voltage ($V_{DD}$) via a respective PMOS bit-line load 241, 242. As such, the maximum voltage at the bit lines 221, 222 can be relatively high when the bit lines 221, 222 are charged to maintain stability of the cell 21.

The cell-sensing unit includes a current sense amplifier 30 connected to the bit lines 221, 222, a voltage amplifier 40 connected to the current sense amplifier 30, and a biasing circuit 50 connected to the current sense amplifier 30 for providing a biasing voltage ($V_{bias}$) thereto when the biasing circuit 50 is enabled.

Figure 4:
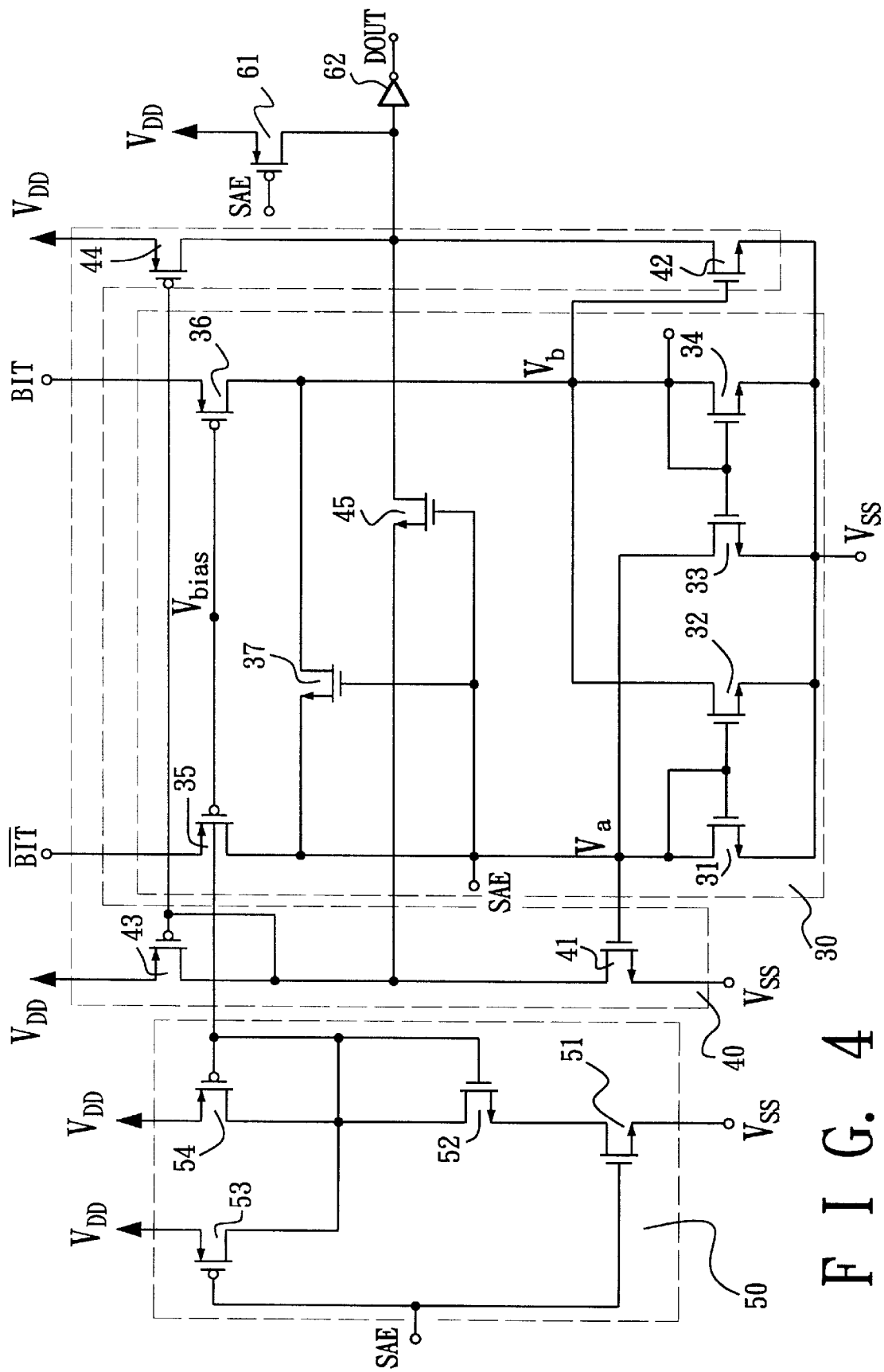
FIG. 4 is a schematic circuit diagram illustrating the preferred embodiment.

Referring to FIG. 4, the current sense amplifier 30 includes first to sixth transistors 31–36.

The first transistor 31 is an NMOS transistor having a first drain terminal, a first source terminal adapted to receive a source supply voltage ($V_{SS}$), and a first gate terminal connected to the first drain terminal.

The second transistor 32 is an NMOS transistor having a second drain terminal, a second source terminal connected to the first source terminal, and a second gate terminal connected to the first gate terminal.

The third transistor 33 is an NMOS transistor having a third drain terminal connected to the first drain terminal, a third source terminal connected to the first source terminal, and a third gate terminal.

The fourth transistor 34 is an NMOS transistor having a fourth drain terminal connected to the second drain terminal, a fourth source terminal connected to the first source terminal, and a fourth gate terminal connected to the third gate terminal and the fourth drain terminal.

The fifth transistor 35 is a PMOS transistor having a fifth drain terminal connected to the bit line 222, a fifth source terminal connected to the first drain terminal, and a fifth gate terminal.

The sixth transistor 36 is a PMOS transistor having a sixth drain terminal connected to the bit line 221, a sixth source terminal connected to the fourth drain terminal, and a sixth gate terminal connected to the fifth gate terminal.

The fifth and sixth drain terminals serve as an input side of the current sense amplifier 30. The first and fourth drain terminals serve as an output side of the current sense amplifier 30.

The voltage amplifier 40 includes first to fourth transistor members 41–44.

The first transistor member 41 is an NMOS transistor having a first drain, a first source adapted to receive the source supply voltage ($V_{SS}$) and a first gate connected to the first drain terminal of the first transistor 31 of the current sense amplifier 30.

The second transistor member 42 is an NMOS transistor having a second drain, a second source adapted to receive the source supply voltage ($V_{SS}$), and a second gate connected to the fourth drain terminal of the fourth transistor 34 of the current sense amplifier 30.

The third transistor member 43 is a PMOS transistor having a third drain adapted to receive a drain supply voltage ($V_{DD}$), a third source connected to the first drain, and a third gate connected to the third source.

The fourth transistor member 44 is a PMOS transistor having a fourth drain adapted to receive the drain supply voltage ($V_{DD}$), a fourth source connected to the second drain, and a fourth gate connected to the third gate.

The first gate and the second gate serve as the input side of the voltage amplifier 40. The second drain serves as the output side of the voltage amplifier 40.

The biasing circuit 50 includes first to fourth transistor elements 51–54.

The first transistor element 51 is an NMOS transistor having a first drain end, a first source end adapted to receive the source supply voltage ($V_{SS}$), and a first gate end adapted to receive the amplifier enable signal (SAE).

The second transistor element 52 is an NMOS transistor having a second drain end, a second source end connected to the first drain end, and a second gate end connected to the second drain end.

The third transistor element 53 is a PMOS transistor having a third drain end adapted to receive the drain supply voltage ($V_{DD}$), a third source end connected to the second drain end, and a third gate end adapted to receive the amplifier enable signal (SAE).

The fourth transistor element 54 is a PMOS transistor having a fourth drain end adapted to receive the drain supply voltage ($V_{DD}$), a fourth source end connected to the second drain end, and a fourth gate end connected to the fourth source end and further connected to the fifth and sixth gate terminals of the fifth and sixth transistors 35, 36 of the current sense amplifier 30.

Figure 5:
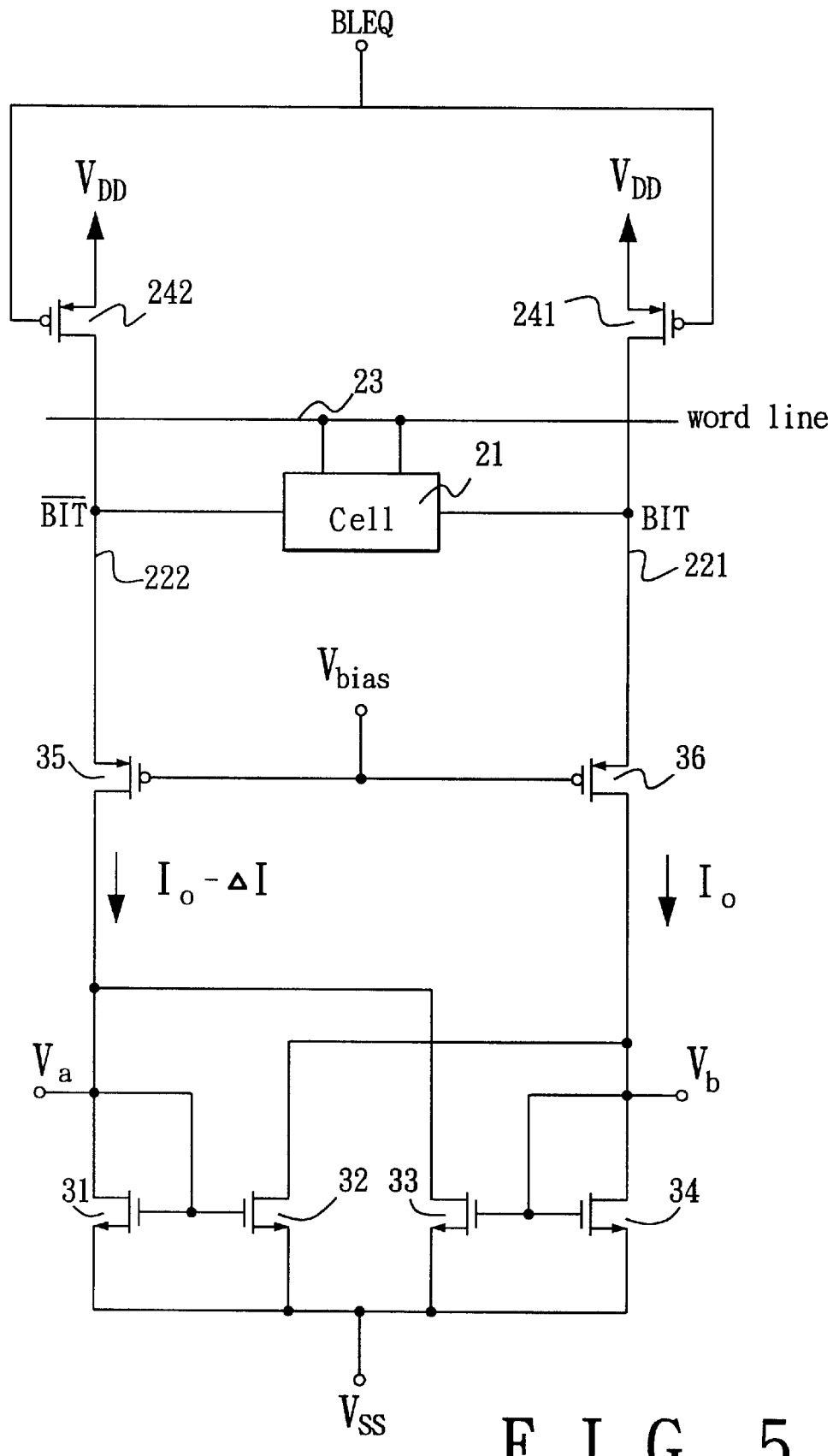
FIG. 5 is a schematic circuit diagram illustrating a current sense amplifier of the preferred embodiment applied to a memory device.

The operation of the current sense amplifier 30 is as follows:

Referring to FIG. 5, which illustrates the current sense amplifier 30 when applied to a memory device, prior to a read cycle of the cell 21 (BLEQ is "0"), the word line 23 is initially inactive, and the bit lines 221, 222 are pre-charged such that an initial current ($I_o$) flows through the bit lines 221, 222. During the read cycle of the cell 21 (BLEQ is "1"), pre-charging of the bit lines 221, 222 is terminated, and the word line 23 is activated. Assuming that a data "1" is stored in the cell 21, the bit line (BIT) 221 will be charged by the cell 21, whereas the bit line (/BIT) 222 will discharge via the cell 21. Thus, the current flowing through the bit line (BIT) 221 will be maintained at ($I_o$), while the current flowing through the bit line (/BIT) 222 will be ($I_o - \Delta I$), where $\Delta I$ is the current drop due to discharging of the bit line (/BIT) 222 via the cell 21. Because the current flow through the bit line (BIT) 221 is greater than that through the bit line (/BIT) 222, the drain current of the fourth transistor 34 will be greater than the drain current of the first transistor 31. Because the first, second, third and fourth transistors 31, 32, 33, 34 form a current-mirror configuration, the drain current of the second transistor 32 is equal to that of the first transistor 31, while the drain current of the third transistor 33 is equal to that of the fourth transistor 34. The current ($I_o$) is equal to the sum of the drain currents of the second and fourth transistors 32, 34, and the current ($I_o - \Delta I$) is equal to the sum of the drain currents of the first and third transistors 31, 33. Thus, whenever the drain current of the third transistor 33 is larger than that of the second transistor 32, the difference between the drain currents of the first and fourth transistors 31, 34 will be further increased, thereby resulting in positive feedback.

In addition, because the bit line (/BIT) 222 continues to discharge via the cell 21 and the first and third transistors 31, 33, the voltage thereat will drop. The current at the bit line (/BIT) 222 will continue to drop to further increase the speed at which the aforesaid drain current difference is formed. Eventually, the drain current of the first transistor 31 will be approximately equal to 0 A, while that of the fourth transistor 34 will be approximately equal to ($I_o$). Thus, the voltage (Va) at the drain of the first transistor 31 will be approximately equal to 0 volt, while the voltage (Vb) at the drain of the fourth transistor 34 will be maintained at a certain high logic state.

Referring again to FIG. 4, as described hereinbefore, the first drain terminal of the first transistor 31 is connected to the first gate of the first transistor member 41 of the voltage amplifier 40, while the fourth drain terminal of the fourth transistor 34 is connected to the second gate of the second transistor member 42 of the voltage amplifier 40. Thus, the first and fourth drain terminals of the first and fourth transistors 31, 34 serve as the output side of the current sense amplifier 30, and the first and second gates of the first and second transistor members 41, 42 serve as the input side of the voltage amplifier 40. By virtue of the current sense amplifier 30, the voltage difference present at the input side of the voltage amplifier 40 has a magnitude sufficient to enable the latter to quickly generate a full-swing output signal at the output side thereof corresponding to the data stored in the cell 21.

It has been mentioned beforehand that the biasing circuit 50 provides a biasing voltage ($V_{bias}$) to the current sense amplifier 30 when the former is enabled. Particularly, the biasing circuit 50 provides the biasing voltage ($V_{bias}$) to the fifth and sixth gate terminals of the fifth and sixth transistors 35, 36 of the current sense amplifier 30 to ensure operation of the fifth and sixth transistors 35, 36 in the appropriate region.

Referring to FIG. 6, which illustrates the biasing circuit 50, prior to operation of the cell-sensing unit, the amplifier enable signal (SAE) is maintained at a low logic state. The third transistor element 53 is turned on, and the biasing voltage ($V_{bias}$) is pulled to the drain supply voltage ($V_{DD}$), thereby turning off the fifth and sixth transistors 35, 36 of the current sense amplifier 30 (see FIG. 4). When the cell-sensing unit operates, the amplifier enable signal (SAE) changes to a high logic state. The third transistor element 53 is turned off, while the first transistor element 51 is turned on. At this time, the second and fourth transistor elements 52, 54 form an inverter circuit 55 with an input end connected to an output end, as shown in FIG. 7. The magnitude of the biasing voltage ($V_{bias}$) is determined according to the ratio of the dimensions of the second and fourth transistor elements 52, 54, and should be sufficient to enable operation of the fifth and sixth transistors 35, 36 of the current sense amplifier 30 in the saturation region during the initial operating stage of the latter. In this way, the signals at the bit lines 221, 222 can be received by the current sense amplifier 30 when the amplifier enable signal (SAE) is at the high logic state.

Referring again to FIG. 4, the current sense amplifier 30 preferably includes a seventh transistor 37, which is an NMOS transistor having a seventh drain terminal connected to the fourth drain terminal, a seventh source terminal connected to the first drain terminal, and a seventh gate terminal adapted to receive the amplifier enable signal (SAE). The seventh transistor 37 ensures that the bit lines (BIT) and (/BIT) 221, 222 are at the same voltage during the pre-charge operation when the amplifier enable signal (SAE) is at the high logic state.

Preferably, the voltage amplifier 40 further includes a fifth transistor member 45, which is an NMOS transistor having a fifth drain connected to the second drain, a fifth source connected to the first drain, and a fifth gate adapted to receive the amplifier enable signal (SAE). The fifth transistor member 45 ensures accurate operation of the voltage amplifier 40 when the amplifier enable signal (SAE) is at the high logic state.

In the preferred embodiment, a pull-up PMOS transistor 61 is connected to the second drain of the second transistor member 42, which serves as the output side of the voltage amplifier 40. The PMOS transistor 61 has a gate to receive the amplifier enable signal (SAE), and is controlled by the latter to further ensure accurate operation of the cell-sensing unit. An inverter 62 has an input end connected to the second drain of the second transistor member 42, and the output of the cell-sensing unit can be obtained from the output end of the inverter 62.

It has thus been shown that the current sense amplifier 30 acts to magnify a difference between currents that flow through the bit lines 221, 222 during a read cycle of the cell 21, and generates a corresponding voltage difference that is provided to the voltage amplifier 40. The voltage difference is larger than a predetermined noise margin, and falls within an optimum operating range, such as $\frac{1}{2}V_{DD}$, of the voltage amplifier 40. Therefore, even when the bit line voltage difference is relatively small, a stable full-swing output signal corresponding to the data in the cell 21 can be accurately and quickly obtained from the voltage amplifier 40. The cell-sensing unit of this invention is thus ideal for use in low supply voltage applications. Moreover, because the present invention employs a first-stage current sense amplifier 30 followed by a second-stage voltage amplifier 40, delays due to the presence of a large parasitic capacitance across the bit lines 221, 222, which has an adverse affect on the charging and discharging speed of the bit lines 221, 222, can be avoided. In addition, power consumption is lowered since the duration of large current flow during the initial operating stage of the current sense amplifier 30 can be dramatically reduced in the cell-sensing unit of this invention. The cell-sensing unit of this invention is suitable for various high-speed memory applications, such as static random access memory (SRAM), dynamic random access memory (DRAM), read-only memory (ROM), etc.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A cell-sensing unit for a memory device having a cell associated operably with a complementary pair of bit lines and a word line, said cell-sensing unit comprising:

a current sense amplifier having a first input side connected to the bit lines, and a first output side; and a voltage amplifier having a second input side connected to said first output side of said current sense amplifier, and a second output side;

said current sense amplifier being capable of magnifying a difference between currents flowing through the bit lines during a read cycle of the cell, and generating a corresponding voltage difference at said first output side, the voltage difference being received by said voltage amplifier at said second input side and having a magnitude sufficient to enable said voltage amplifier to generate an output signal at said second output side corresponding to data stored in the cell.

2. The cell-sensing unit as claimed in claim 1, wherein said current sense amplifier includes:

a first transistor having a first drain terminal adapted to be connected to one of the bit lines, a first source terminal adapted to receive a source supply voltage, and a first gate terminal connected to said first drain terminal;

a second transistor having a second drain terminal adapted to be connected to the other one of the bit lines, a second source terminal connected to said first source terminal, and a second gate terminal connected to said first gate terminal;

a third transistor having a third drain terminal connected to said first drain terminal, a third source terminal connected to said first source terminal, and a third gate terminal; and a fourth transistor having a fourth drain terminal connected to said second drain terminal, a fourth source terminal connected to said first source terminal, and a fourth gate terminal connected to said third gate terminal and said fourth drain terminal;

said first drain terminal and said fourth drain terminal serving as said first output side of said current sense amplifier.

3. The cell-sensing unit as claimed in claim 2, wherein said first, second, third and fourth transistors are NMOS transistors.

4. The cell-sensing unit as claimed in claim 2, wherein said voltage amplifier includes:

a first transistor member having a first drain, a first source adapted to receive the source supply voltage, and a first gate connected to said first drain terminal of said first transistor of said current sense amplifier;

a second transistor member having a second drain, a second source adapted to receive the source supply voltage, and a second gate connected to said fourth drain terminal of said fourth transistor of said current sense amplifier;

a third transistor member having a third drain adapted to receive a drain supply voltage, a third source connected to said first drain, and a third gate connected to said third source; and a fourth transistor member having a fourth drain adapted to receive the drain supply voltage, a fourth source connected to said second drain, and a fourth gate connected to said third gate;

said first gate and said second gate serving as said second input side of said voltage amplifier;

said second drain serving as said second output side of said voltage amplifier.

5. The cell-sensing unit as claimed in claim 4, wherein said first and second transistor members are NMOS transistors, and said third and fourth transistor members are PMOS transistors.

6. The cell-sensing unit as claimed in claim 2, wherein said cell-sensing unit further includes:

a fifth transistor having a fifth source terminal connected to said first drain terminal, a fifth gate terminal, and a fifth drain terminal adapted to be connected to said one of the bit lines such that connection between said first drain terminal and said one of the bit lines is established via said fifth transistor; and a sixth transistor having a sixth source terminal connected to said fourth drain terminal, a sixth gate terminal connected to said fifth gate terminal, and a sixth drain terminal adapted to be connected to the other one of the bit lines such that connection between said second drain terminal and the other one of the bit lines is established via said sixth transistor;

said fifth drain terminal and said sixth drain terminal serving as said first input side of said current sense amplifier.

7. The cell-sensing unit as claimed in claim 6, wherein said fifth and sixth transistors are PMOS transistors.

8. The cell-sensing unit as claimed in claim 6, further comprising a biasing circuit connected to said fifth and sixth gate terminals of said fifth and sixth transistors, said biasing circuit being adapted to receive an amplifier enable signal and providing a biasing voltage for operating said fifth and sixth transistors in a saturation region upon receiving the biasing voltage.

9. The cell-sensing unit as claimed in claim 8, wherein said biasing circuit includes:

a first transistor element having a first drain end, a first source end adapted to receive the source supply voltage, and a first gate end adapted to receive the amplifier enable signal;

a second transistor element having a second drain end, a second source end connected to said first drain end, and a second gate end connected to said second drain end;

a third transistor element having a third drain end adapted to receive a drain supply voltage, a third source end connected to said second drain end, and a third gate end adapted to receive the amplifier enable signal; and a fourth transistor element having a fourth drain end adapted to receive the drain supply voltage, a fourth source end connected to said second drain end, and a fourth gate end connected to said fourth source end and further connected to said fifth and sixth gate terminals of said fifth and sixth transistors of said current sense amplifier.

10. The cell-sensing unit as claimed in claim 9, wherein said first and second transistor elements are NMOS transistors, and said third and fourth transistor elements are PMOS transistors.

11. A memory device comprising a complementary pair of bit lines, a word line, a cell associated operably with said bit lines and said word line, a pair of PMOS bit line loads connected respectively to said bit lines, and a cell-sensing unit including:

a current sense amplifier having a first input side connected to said bit lines, and a first output side; and a voltage amplifier having a second input side connected to said first output side of said current sense amplifier, and a second output side;

said current sense amplifier being capable of magnifying a difference between currents flowing through said bit lines during a read cycle of said cell, and generating a corresponding voltage difference at said first output side, the voltage difference being received by said voltage amplifier at said second input side and having a magnitude sufficient to enable said voltage amplifier to generate an output signal at said second output side corresponding to data stored in said cell.

12. The memory device as claimed in claim 11, wherein said current sense amplifier includes:

a first transistor having a first drain terminal connected to one of said bit lines, a first source terminal adapted to receive a source supply voltage, and a first gate terminal connected to said first drain terminal;

a second transistor having a second drain terminal connected to the other one of said bit lines, a second source terminal connected to said first source terminal, and a second gate terminal connected to said first gate terminal;

a third transistor having a third drain terminal connected to said first drain terminal, a third source terminal connected to said first source terminal, and a third gate terminal; and a fourth transistor having a fourth drain terminal connected to said second drain terminal, a fourth source terminal connected to said first source terminal, and a fourth gate terminal connected to said third gate terminal and said fourth drain terminal;

said first drain terminal and said fourth drain terminal serving as said first output side of said current sense amplifier.

13. The memory device as claimed in claim 12, wherein said first, second, third and fourth transistors are NMOS transistors.

14. The memory device as claimed in claim 12, wherein said voltage amplifier includes:

a first transistor member having a first drain, a first source adapted to receive the source supply voltage, and a first gate connected to said first drain terminal of said first transistor of said current sense amplifier;

a second transistor member having a second drain, a second source adapted to receive the source supply voltage, and a second gate connected to said fourth drain terminal of said fourth transistor of said current sense amplifier;

a third transistor member having a third drain adapted to receive a drain supply voltage, a third source connected to said first drain, and a third gate connected to said third source; and a fourth transistor member having a fourth drain adapted to receive the drain supply voltage, a fourth source connected to said second drain, and a fourth gate connected to said third gate;

said first gate and said second gate serving as said second input side of said voltage amplifier;

said second drain serving as said second output side of said voltage amplifier.

15. The memory device as claimed in claim 14, wherein said first and second transistor members are NMOS transistors, and said third and fourth transistor members are PMOS transistors.

16. The memory device as claimed in claim 12, wherein said cell-sensing unit further includes:

a fifth transistor having a fifth source terminal connected to said first drain terminal, a fifth gate terminal, and a fifth drain terminal connected to said one of the bit lines such that connection between said first drain terminal and said one of the bit lines is established via said fifth transistor; and a sixth transistor having a sixth source terminal connected to said fourth drain terminal, a sixth gate terminal connected to said fifth gate terminal, and a sixth drain terminal connected to the other one of said bit lines such that connection between said second drain terminal and the other one of said bit lines is established via said sixth transistor;

said fifth drain terminal and said sixth drain terminal serving as said first input side of said current sense amplifier.

17. The memory device as claimed in claim 16, wherein said fifth and sixth transistors are PMOS transistors.

18. The memory device as claimed in claim 16, wherein said cell-sensing unit further includes a biasing circuit connected to said fifth and sixth gate terminals of said fifth and sixth transistors, said biasing circuit being adapted to receive an amplifier enable signal and providing a biasing voltage for operating said fifth and sixth transistors in a saturation region upon receiving the biasing voltage.

19. The memory device as claimed in claim 18, wherein said biasing circuit includes:
- a first transistor element having a first drain end, a first source end adapted to receive the source supply voltage, and a first gate end adapted to receive the amplifier enable signal;
- a second transistor element having a second drain end, a second source end connected to said first drain end, and a second gate end connected to said second drain end;
- a third transistor element having a third drain end adapted to receive a drain supply voltage, a third source end connected to said second drain end, and a third gate end adapted to receive the amplifier enable signal; and
- a fourth transistor element having a fourth drain end adapted to receive the drain supply voltage, a fourth source end connected to said second drain end, and a fourth gate end connected to said fourth source end and further connected to said fifth and sixth gate terminals of said fifth and sixth transistors of said current sense amplifier.

20. The memory device as claimed in claim 19, wherein said first and second transistor elements are NMOS transistors, and said third and fourth transistor elements are PMOS transistors.

* * * * *